United States Patent [19]
Baba et al.

[11] Patent Number: 5,534,735
[45] Date of Patent: Jul. 9, 1996

[54] PHOTO SI THYRISTOR DRIVING CIRCUIT AND ITS PROTECTION CIRCUIT

[75] Inventors: Akira Baba; Kazuo Sugimura; Satoshi Miwa; Keizo Yamamoto; Masayuki Saito, all of Susono, Japan

[73] Assignee: Yazaki Corporation, Tokyo, Japan

[21] Appl. No.: 272,530

[22] Filed: Jul. 11, 1994

[30] Foreign Application Priority Data

Jul. 12, 1993 [JP] Japan ................................. 5-171318
Jun. 13, 1994 [JP] Japan ................................. 6-130256

[51] Int. Cl.⁶ .................................................. H01H 47/24
[52] U.S. Cl. .......................... 307/117; 327/438; 327/440
[58] Field of Search ................................... 307/117, 125, 307/126, 131, 140; 327/438, 440; 354/429; 315/158

[56] References Cited

U.S. PATENT DOCUMENTS

| | | | |
|---|---|---|---|
| 3,816,763 | 6/1974 | Korn et al. | 307/252 |
| 3,967,138 | 12/1974 | Mitsuoka et al. | 307/252 |
| 4,176,288 | 11/1979 | Komatsu et al. | 307/252 |
| 4,322,637 | 3/1982 | Tagasago | 307/252 |
| 5,017,991 | 5/1991 | Nishizawa et al. | 357/38 |

*Primary Examiner*—William M. Shoop, Jr.
*Assistant Examiner*—Albert W. Paladini
*Attorney, Agent, or Firm*—Armstrong, Westerman, Hattori, McLeland & Naughton

[57] ABSTRACT

A photo SI thyristor driving circuit which has a good switching characteristic suitable to be used for a photo relay, and a protection circuit therefor for protecting a photo SI thyristor element from being broken down due to a thermal runaway. The photo SI thyristor driving circuit comprises a photo SI thyristor, a MOS transistor provided in a gate circuit of the photo SI thyristor to draw charges accumulated at the gate of the photo SI thyristor when the photo SI thyristor is turned off, and a plurality of photo electromotive force elements provided in a gate circuit of the MOS transistor to generate a photo current for biasing the MOS transistor. The protection circuit includes a snubber circuit connected between the anode and the cathode of the photo SI thyristor and a light emitting element for irradiating light to the photo electromotive elements in response to an output from the snubber circuit.

11 Claims, 13 Drawing Sheets

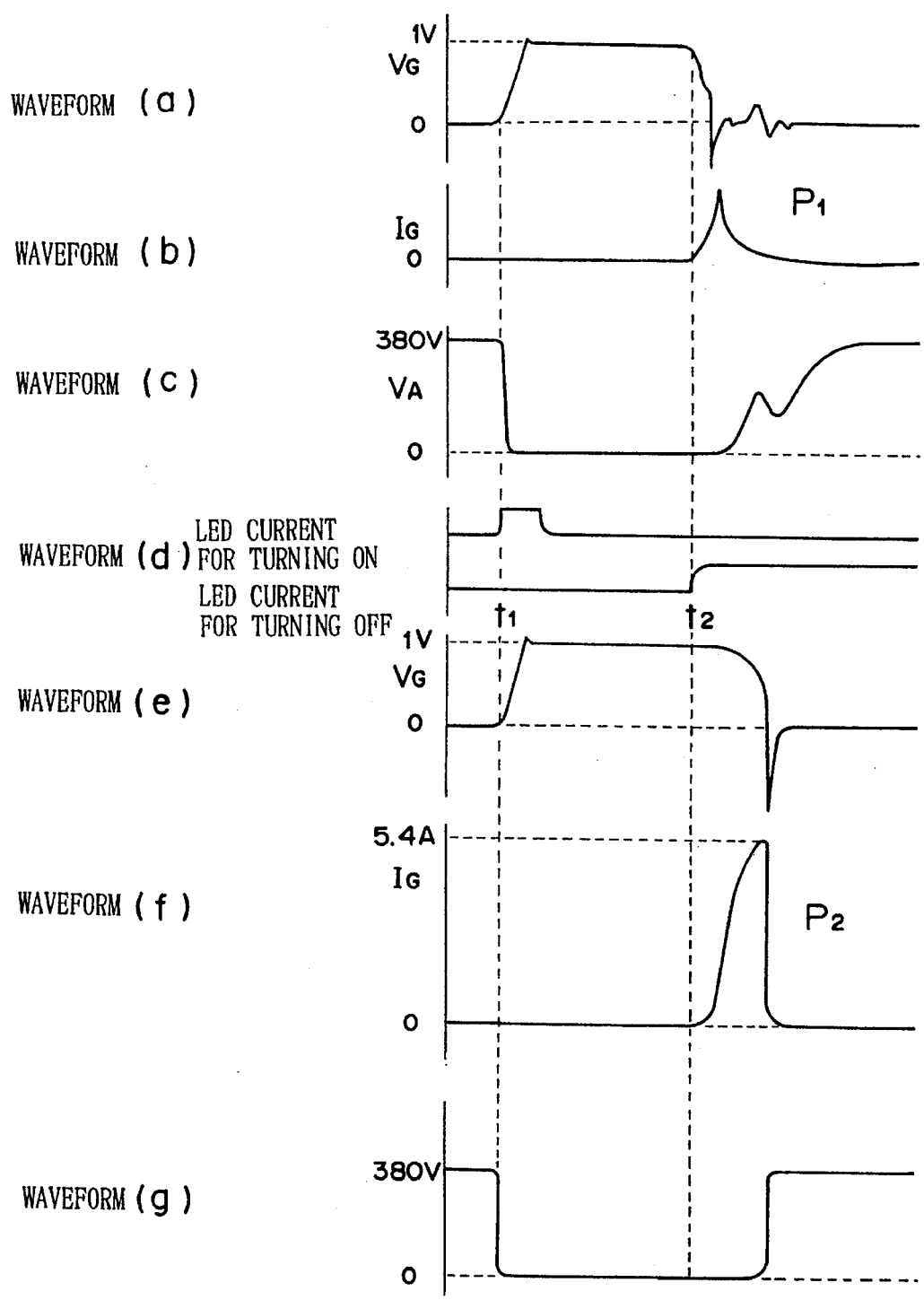

FIG. 12
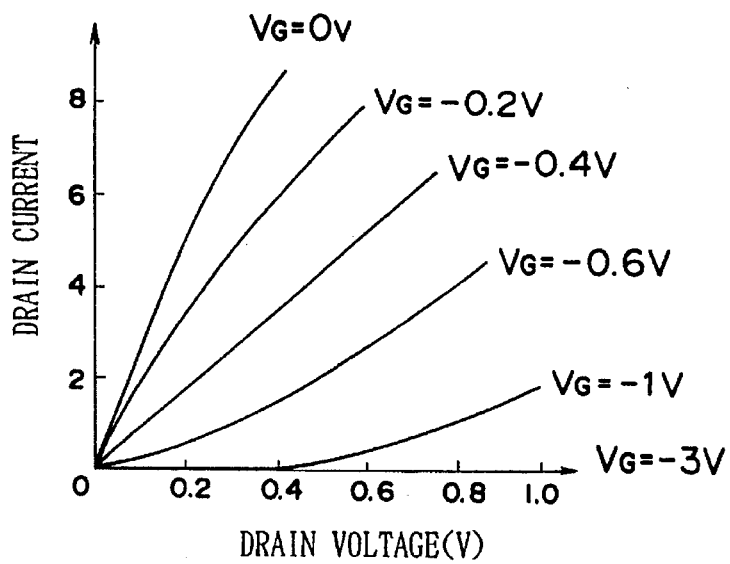
FIG. 13A  FIG. 13B
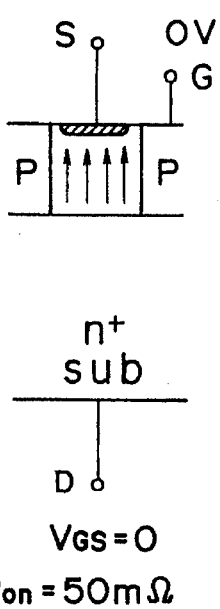 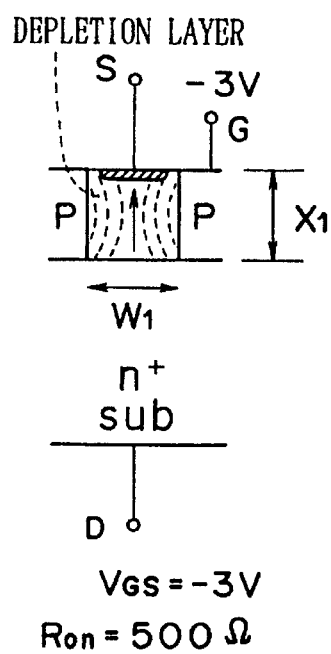

| $V_{AK}$ | : ANODE-CATHODE VOLTAGE OF PHOTO SI THYRISTOR |
| --- | --- |
| $I_{AK}$ | : ANODE-CATHODE CURRENT OF PHOTO SI THYRISTOR |
| $I_{GOFF}$ | : TURNING-OFF GATE CURRENT OF PHOTO SI THYRISTOR |
| $R_{on(SIT)}$ | : SIT RESISTOR |
| $V_{G(SIT)}$ | : GATE VOLTAGE OF SIT |
| $I_{LT1}$ | : TRIGGERING CURRENT (FOR PHOTO SI THYRISTOR) |
| $I_{LT2}$ | : CURRENT FOR CHANGING DRAIN-SOURCE RESISTOR OF SIT |

5,534,735

PHOTO SI THYRISTOR DRIVING CIRCUIT AND ITS PROTECTION CIRCUIT

BACKGROUND OF THE INVENTION

1. Field of the Invention

The present invention relates to a photo SI (static induction) thyristor driving circuit and its protection circuit, and more particularly to a photo SI thyristor driving circuit which can be used as a photo relay capable of controlling the flow of a large amount of current and having a high voltage resisting characteristic and to a protection circuit for preventing the photo SI thyristor from being thermally broken when the turning-on current of the photo SI thyristor flows excessively.

2. Description of the Related Art

A photo SI (static induction) thyristor is typically used as a photo relay because it has a high voltage resisting characteristic and can control the flow of a large amount of current.

FIG. 15 is a prior art example of a photo SI thyristor driving circuit, in which photo SI thyristors are indicated by numerals 1a and 1b. A resistor Ra is connected between a gate and a cathode of the photo SI thyristor 1a, and a resistor Rb is connected between a gate and a cathode of the photo SI thyristor 1b. The anode of the photo SI thyristor 1a is connected to a load 3 to which a voltage source E1 is connected, and the the cathode of the photo SI thyristor 1a is grounded. The gate of the photo SI thyristor 1a is connected to the anode of the photo SI thyristor 1b, the cathode of which is connected to a negative voltage source E2.

The photo SI thyristor 1a is turned on in response to the incidence of a trigger light LT, while the photo SI thyristor 1b is turned on in response to the incidence of a quenching light LQ. When the photo SI thyristor 1b is turned on, electric charges accumulated at the gate of the photo SI thyristor 1a are removed or drawn so as to turn off the photo SI thyristor 1a.

FIG. 16 is another example of a photo SI thyristor driving circuit. In this driving circuit, an electrolytic condensor C is connected between the gate of a photo SI thyristor 1a and the anode of a photo SI thyristor 1b, and the cathodes of the photo SI thyristors 1a and 1b are connected together and grounded. The anode of the photo SI thyristor 1b is connected to a common point of the cathodes of photo SI thyristors 5a and 5b connected in a darlington form, A resistor Rc is connected between the anode of photo SI thyristor 5a and the gate of the photo SI thyristor 5b.

A load 3 is connected between the anode of the photo SI thyristor 1a and a voltage source E1. A voltage source E3 is connected to the connecting point of the anode of the photo SI thyristor 5a and the resistor Rc.

As described above, the photo SI thyristor driving circuit of FIG. 15 must be provided with positive and negative voltage sources, so that there is a disadvantage in that the driving circuit is complex. In order to overcome this disadvantage, the photo SI thyristor driving circuit of FIG. 16 substitutes the electrolytic condensor C for the negative voltage source to generate a negative bias voltage, which is applied to the gate of the photo SI thyristor 1a to turn off the photo SI thyristor 1a. However, as the electrolytic condensor C must be installed at the outside of a package, a number of parts to be installed increases. Further as the positive voltage source E3 applied to the photo SI thyristors connected in the form of darlington must be provided, an improvement is required.

It is required that photo SI thyristors have a good switching characteristic if they are utilized as optical relays. However, in the photo SI thyristor driving circuits shown, in turning on the photo SI thyristors, charges must be accumulated at the gate thereof, while in turning off them, charges accumulated at the gate must be drawn. Accordingly, constituting the driving circuit with two stages of the photo SI thyristors for switching, as shown in FIG. 15, is a cause for delaying of switching performance of the photo SI thyristor 1a.

Further, it is necessary to provide the photo SI thyristor with a protection circuit against excess current because the photo SI thyristor element is possibly broken down due to heat occurring when excess current more than rated current of the element flows as a turning-on current.

SUMMARY OF THE INVENTION

The object of the present invention is to provide a photo SI thyristor driving circuit having a good switching characteristic for a photo relay, and a protection circuit for protecting the photo SI thyristor element from breaking down due to thermal runaway.

Another object of the present invention is to provide a photo SI thyristor driving circuit free of a negative bias voltage source mounted at the outside of a package.

In order to achieve the above objects, a photo SI thyristor driving circuit in accordance with the present invention comprises: a photo SI thyristor; transistor means provided in a gate circuit of said photo SI thyristor to draw charges accumulated at the gate of said photo SI thyristor when said photo SI thyristor is turned off; and photo electromotive force means provided in a gate circuit of said transistor means to generate a photo current for applying a gate voltage to the gate of said transistor means.

Said transistor means may include a MOS transistor which is biased by said gate voltage.

Only one thyristor is used for switching operation in the driving circuit. In order to turn off the photo SI thyristor, the transistor means or the MOS transistor which is biased by the photo electromotive force from the photo electromotive force means is used for drawing charges accumulated at the gate of the photo SI thyristor to turn off the same. Thereby there is no need to provide a negative voltage source which was necessary in the prior art. Further, the switching characteristic for the photo SI thyristor is improved.

In one aspect of the present invention, a photo SI thyristor driving circuit comprises: a photo SI thyristor; transistor means provided in a gate circuit of said photo SI thyristor to draw charges accumulated at the gate of said photo SI thyristor when said photo SI thyristor is turned off; photo electromotive force means provided in a gate circuit of said transistor means to generate a photo current for biasing said transistor means; a condensor connected in parallel to said photo electromotive force means to be charged by said photo current from said photo electromotive force means; a photo coupler provided in the gate circuit of said transistor means to supply the photo current from said photo electromotive force means and the charged current from said condensor.

When the transistor means is about to be turned on to turn off photo SI thyristor, the charged voltage of the condensor is instantaneously applied as a bias voltage to the gate of the transistor means through the photo coupler, whereby the switching characteristic is improved.

The photo SI thyristor driving circuit may further comprises an inductor connected between the gate of said photo SI thyristor and the drain of said transistor means or between the cathode of said photo SI thyristor and the source of said transistor means.

As a negative voltage due to a back electromotive force which generates at the inductor after turning on the transistor means is applied to the gate of the photo SI thyristor, the turning-off operation of the photo SI thyristor is stabilized and the switching characteristic of the photo SI thyristor is improved.

There is also provided a protection circuit for said photo SI thyristor driving circuit comprising a snubber circuit connected between the anode and the cathode of said photo SI thyristor and a light emitting element irradiating light to said photo electromotive force means by means of the output from said snubber circuit wherein said photo SI thyristor is controlled by the emitting of said light emitting element.

When current more than the predetermined current value flows into the snubber circuit, the snubber circuit provides an output to the light emitting element, which irradiates the quenching light to the photo electromotive force means thereby to turn on the MOS transistor, thus controlling the turning-off of the photo SI thyristor.

In another aspect of the present invention, there is provided a photo SI thyristor driving circuit comprising: a photo SI thyristor; a MOS transistor means provided in a gate circuit of said photo SI thyristor to draw charges accumulated at the gate of said photo SI thyristor when said photo SI thyristor is turned off; photo electromotive force means provided in a gate circuit of said MOS transistor means to generate a photo current; at least two resistors connected in series generating a voltage for biasing said MOS transistor means by means of said photo current from said photo electromotive force means; and a diode connected between the drain of said MOS transistor and a connecting point of said two resistors.

After the MOS transistor is turned on to turn off the photo SI thyristor, charges accumulated at the gate of the MOS transistor means is drawn by the diode connected between the drain of the MOS transistor and a connecting point of the two resistors, namely substantially by a potential difference between the drain and the gate of the MOS transistor which draws the charges accumulated at the gate of the photo SI thyristor. Thereby the switching characteristic of the driving circuit is improved.

In a further aspect of the present invention, there is provided a photo SI thyristor driving circuit comprising: a photo SI thyristor; a normally turning-on type SI transistor whose drain is connected to the gate of said photo SI thyristor and whose source is connected to the cathode of said photo SI thyristor, wherein said photo SI thyristor is turned on by being irradiated with a trigger light after the resistance between the drain and the source of said SI transistor is increased, and wherein said photo SI thyristor is turned off when the resistance between the drain and the source of said SI transistor is lowered.

The photo SI thyristor driving circuit may also includes: a photo SI thyristor; a normally turning-on type SI transistor whose drain is connected to the gate of said photo SI thyristor and whose source is connected to the cathode of said photo SI thyristor; a photo electromotive force means whose anode is connected to the gate of said SI transistor and whose cathode is connected to the source of said SI transistor; and a resistor connected in parallel to said photo electromotive force means.

Using the normally turning-on type SI transistor whose resistance between the drain and the source thereof changes by providing a negative bias to the gate of the SI transistor, the resistance between the gate and the cathode of the photo SI thyristor is controlled whereby the turning-on and the turning-off of the photo SI thyristor are controlled.

The photo SI thyristor driving circuit as mentioned above may further includes an inductor connected between the gate of said photo SI thyristor and the drain of said SI transistor or between the cathode of said photo SI thyristor and the source of said SI transistor.

As a negative voltage due to a back electromotive force which generates at the inductor after the resistance between the drain and the source of the SI transistor lowers is applied to the gate of the photo SI thyristor, the turning-off operation of the photo SI thyristor is stabilized and the switching characteristic of the photo SI thyristor is improved.

There is also provided a protection circuit for the above-said photo SI thyristor driving circuit comprising: a snubber circuit connected between the anode and the cathode of said photo SI thyristor; and controlling means for controlling said SI transistor to lower the resistance between the drain and the source of said SI transistor when an output from said snubber circuit is received, thereby to turn off said photo SI thyristor.

When current more than predetermined current value flows into the snubber circuit, the snubber circuit provides an output to the controlling means, which controls the SI transistor to lower the resistance between the drain and the source thereof, thus controlling the turning-off of the photo SI thyristor. This prevents breakdown of the photo SI thyristor.

The aforementioned photo electromotive force means may include a plurality of photo diodes connected in series.

A plurality of photo diodes connected in series can be easily incorporated in a semi-conductor device which is formed with the photo SI thyristor.

BRIEF DESCRIPTION OF THE DRAWINGS

Further objects and advantages of the present invention will be apparent from the following description, reference being had to the accompanying drawings wherein preferred embodiments of the present invention are clearly shown.

In the drawings:

FIG. 9 is a timing diagram for explaining the operation of the embodiments of FIGS. 8A and 8B;

FIG. 12 is a graph showing a characteristic of the SIT element;

FIGS. 13A and 13B are diagrams explaining the principle of the SIT element;

DETAILED DESCRIPTION OF THE PREFERRED EMBODIMENTS

Figure 1:
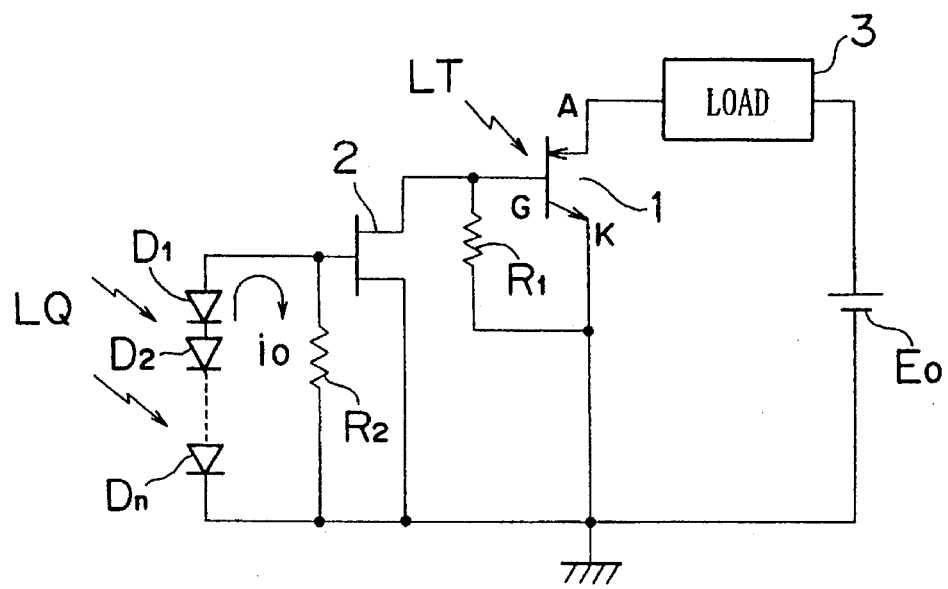
FIG. 1 is a circuit diagram showing a preferred embodiment of the photo SI thyristor driving circuit according to the present invention.

FIG. 1 illustrates a circuit diagram showing an embodiment of a photo SI thyristor driving circuit in accordance with the present invention. A numeral 1 denotes a photo SI thyristor, 2 a MOS transistor such as a field effect transistor, and 3 a load. The anode of the photo SI thyristor 1 is connected to a voltage source E0 through the load 3, the negative electrode of the voltage source E0 and the cathode of the photo SI thyristor 1 being grounded. A resistor R1 is connected between the gate and the cathode of the photo SI thyristor 1, to the gate of which the drain of the MOS transistor 2 is connected. A resistor R2 is connected between the gate and the source of the MOS transistor 2. Photo diodes D1-Dn (photo-voltaic diode array) which are connected in series are connected in parallel to the resistor R2. The source of the MOS transistor 2 is grounded.

In the following, the operation of the photo SI thyristor driving circuit shown in FIG. 1 will be explained with reference to a timing diagram of FIG. 2, the timing diagram illustration the condition where the anode voltage is at 100 volt and the anode current is at 20 ampere.

Figure 2:
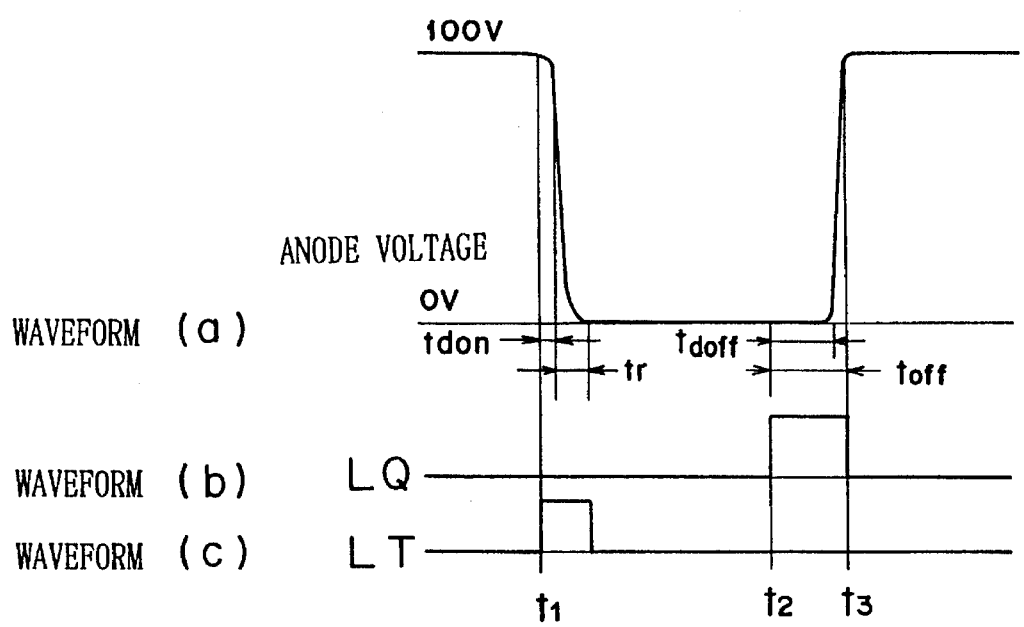
FIG. 2 is a timing diagram showing the operation of the photo SI thyristor driving circuit of FIG. 1, wherein waveform (a) shows an anode voltage of the photo SI thyristor, waveform (b) shows a pulsed quenching light, and waveform (c) shows a pulsed trigger light.

In FIG. 2, (a) is a waveform of the anode voltage of the photo SI thuyristor 1, (b) a waveform showing a radiation timing of a pulsed quenching light LQ for turning off the photo SI thyristor 1, and (c) a waveform showing a radiation timing of a pulsed trigger light LT for turning on the photo SI thyristor 1.

When the photo SI thyristor 1 is irradiated by the trigger light LT at time t1, accumulation of electric charges to the gate of the photo SI thyristor 1 begins. After an elapse of a predetermined turning-on delay time $t_{don}$, the photo SI thyristor 1 is turned on. At time t2, when the quenching light LQ irradiates the photo diodes D1-Dn (for example, ten photo diodes), photo current $i_0$ flows into the resistor R2, across which there is a terminal voltage of about 3.9 volt, is generated. The MOS transistor 2 is biased and turned on by this terminal voltage. The gate voltage of the photo SI thyristor 1 is about 0.6 volt and the charges accumulated at the gate of the photo SI thyristor 1 begin to be drawn through the MOS transistor 2. After an elapse of a predetermined turning-off delay time $t_{doff}$, the photo SI thyristor 1 is turned off at time t3.

The switching characteristic of the photo SI thyristor driving circuit shown as one embodiment in FIG. 1 is shown in the following table 1, in which the switching characteristic was measured in relation to a current value of an LED current ($I_L$) flowing into a light emitting diode which emits the quenching light LQ, while an LED current flowing into a light emitting diode which emits the trigger light LT is kept constant (about 250 mA).

| SWITCHING CHARACTERISTIC IN RELATION TO LED CURRENT ($I_L$) | | |
|---|---|---|
| $I_L$:25 mA | $I_L$:50 mA | $I_L$:100 mA |

| | $I_L$:25 mA | $I_L$:50 mA | $I_L$:100 mA |
|---|---|---|---|
| $t_{don}$ (μs) | 5.5 | 5.5 | 5.5 |
| tr (N SEC) | 3.5 | 3.5 | 3.5 |
| $t_{doff}$ (N SEC) | 23.0 | 16.0 | 13.0 |
| $t_{off}$ (μs) (N SEC) | 29.0 | 22.0 | 19.0 | wherein $t_{don}$ (N SEC): turning-on delay time
$t_{doff}$: turning-off delay time
tr: turning-on rising time
$t_{off}$: turning-off descending time As clearly shown in the above table, the turning-on delay time ($t_{don}$) and the turning-on raising time (tr) do not change in relation to the change of the LED current $I_L$, while the turning-off delay time ($t_{doff}$) and the turning-off descending time ($t_{off}$) are shortened in conjunction with an increase of the LED current $I_L$. Even when the LED current $I_L$ is at 25 mA, the photo SI thyristor demonstrates a good switching characteristic for enabling it to be used as a photo relay.

Figure 3:
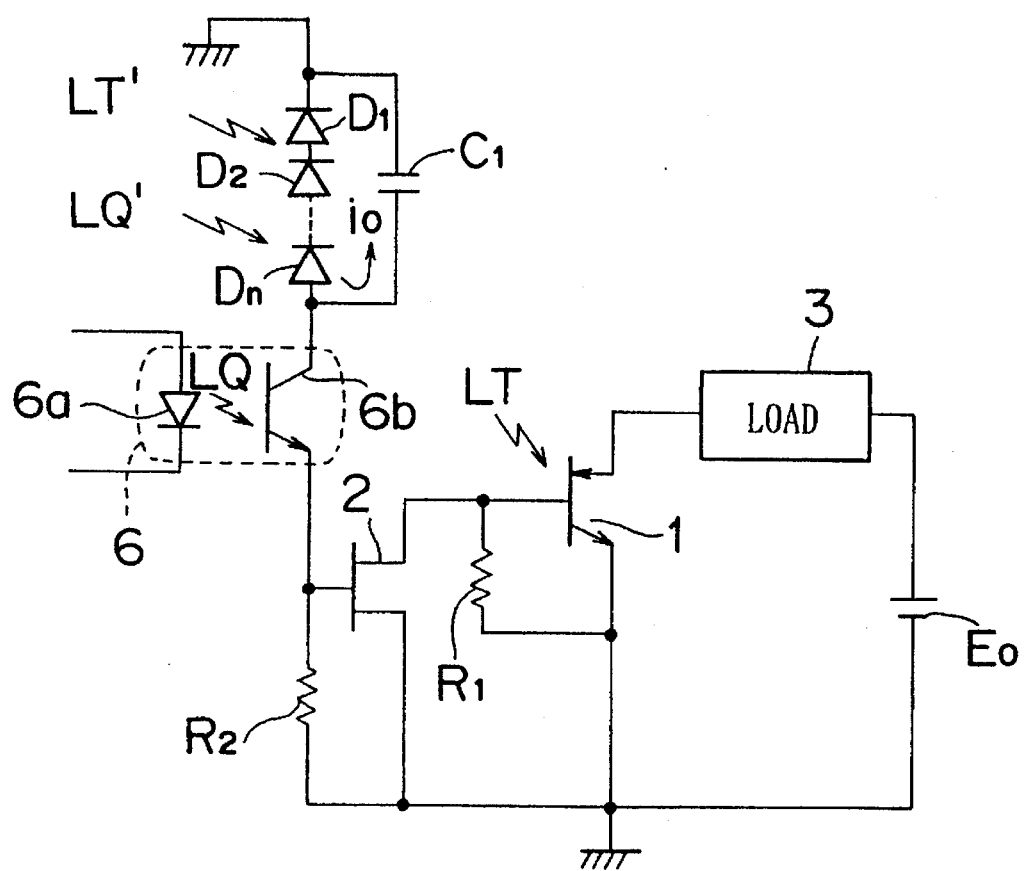
FIG. 3 is a circuit diagram showing another embodiment of the photo SI thyristor driving circuit according to the present invention.

FIG. 3 is a circuit diagram showing another embodiment of the photo SI thyristor driving circuit in accordance with the present invention, in which a bias circuit of the MOS transistor 2 is different from that in the embodiment of FIG. 1, the other remaining circuit constituent elements being identical to those of FIG. 1.

This bias circuit includes: a photo coupler 6 comprising a light emitting diode 6a and a photo transistor 6b; the photo diodes D1-Dn (photo-voltaic diode array) connected in series; a condensor C1 connected in parallel to the series circuit of the photo diodes; and a resistor R2 connected between the gate and the source of the MOS transistor 2.

Explaining briefly the operation of this driving circuit, the photo SI thyristor 1 is turned on when trigger lights LT and LT' are irradiated to the photo SI thyristor 1 and the photo diodes D1-Dn, respectively, and turned off when quenching lights LQ' and LQ are irradiated to the photo diodes D1-Dn and the photo transistor 6b of the photo coupler 6, respectively.

Figure 4A:
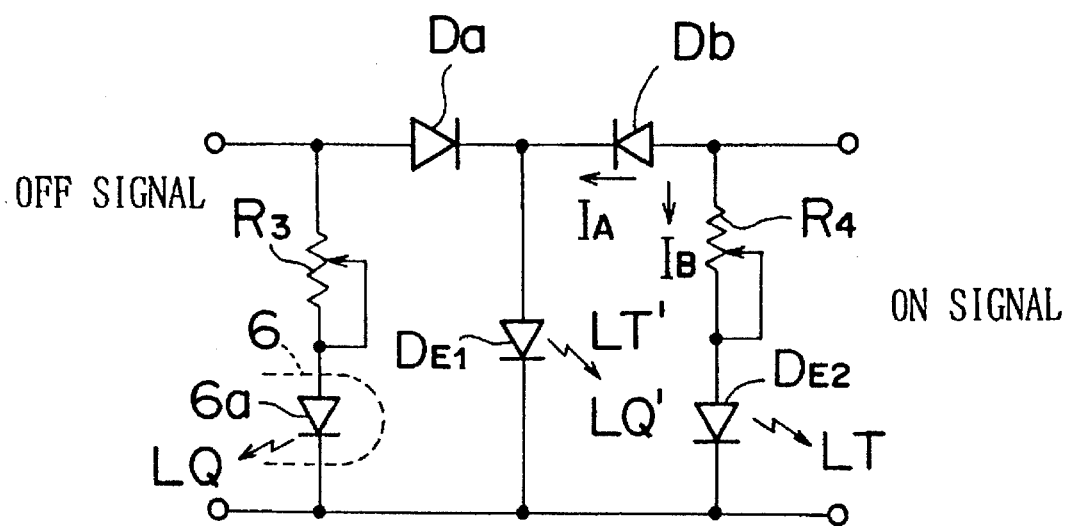
FIG. 4A is a circuit diagram of a photo pulse generating circuit.

FIG. 4A is a circuit diagram showing the photo pulse generating circuit for emitting the trigger lights LT, LT' and the quenching lights LQ, LQ'. This photo pulse generating circuit includes reverse blocking diodes Da, Db connected to each other at the cathodes thereof, a light emitting diode $D_{E1}$ having its anode connected to the cathode of the diodes Da, Db; a variable resistor R3 and a light emitting diode 6a connected in series to the anode of the reverse blocking diode Da; and a variable resistor R4 and a light emitting diode $D_{E2}$ connected in series to the anode of the reverse blocking diode Db. The cathodes of the light emitting diode 6a, $D_{E1}$ and $D_{E2}$ are connected together.

Figure 4B:
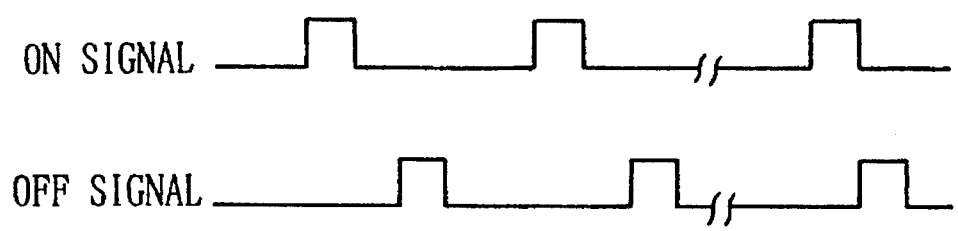
FIG. 4B is timing diagram showing waveforms of an ON signal and an Off signal.

When an ON signal is applied to the photo pulse generating circuit as shown in FIG. 4B, a current $I_A$ flows through the diode Db to the light emitting diode $D_{E1}$ to emit the trigger light LT' which irradiates the photo diodes D1-Dn, whereby the condensor C1 is charged by the photo current $i_0$. Further, a current $I_B$ flows through the variable resistor R4 to the light emitting diode $D_{E2}$ to emit the trigger light LT which is irradiated to the photo SI thyristor 1, whereby the photo SI thyristor 1 is turned on.

When an OFF signal is applied to the photo pulse generating circuit of FIG. 4A, a current flows through the diode Da to the light emitting diode $D_{E1}$ to emit the quenching light LQ' which irradiates to the photo diodes D1-Dn, and a current flows through the variable resistor R3 to the light emitting diode 6a to emit the quenching light LQ which is irradiated to the photo diode 6b, whereby the photo diode 6b is turned on.

The operation of the photo SI thyristor driving circuit in FIG. 3 and the photo pulse generating circuit in FIG. 4A will be explained in more detail below.

When the trigger light LT' is irradiated to the photo diodes D1-Dn, the photo current $i_0$ flows into the condensor C1 to charge same. At the same time, as the trigger light LT irradiates to the photo SI thyristor 1, it is turned on to flow a turning-on current into the load 3. Subsequently, when the quenching light LQ' irradiates the photo diodes D1-Dn and the quenching light LQ irradiates to the photo transistor 6b, the photo current $i_0$ is generated at the photo diodes D1-Dn and the photo transistor 6b is turned on. As the condensor C1 has already been charged, the electric charge in the condensor C1 and the photo current $i_0$ generated at the photo diodes D1-Dn flow together through the photo transistor 6b into the resistor R2, across which a terminal voltage is generated to quickly turn on the MOS transistor 2, whereby the charge accumulated at the gate of the photo SI thyristor 1 is drawn so as to turn off the photo SI thyristor.

Figure 5:
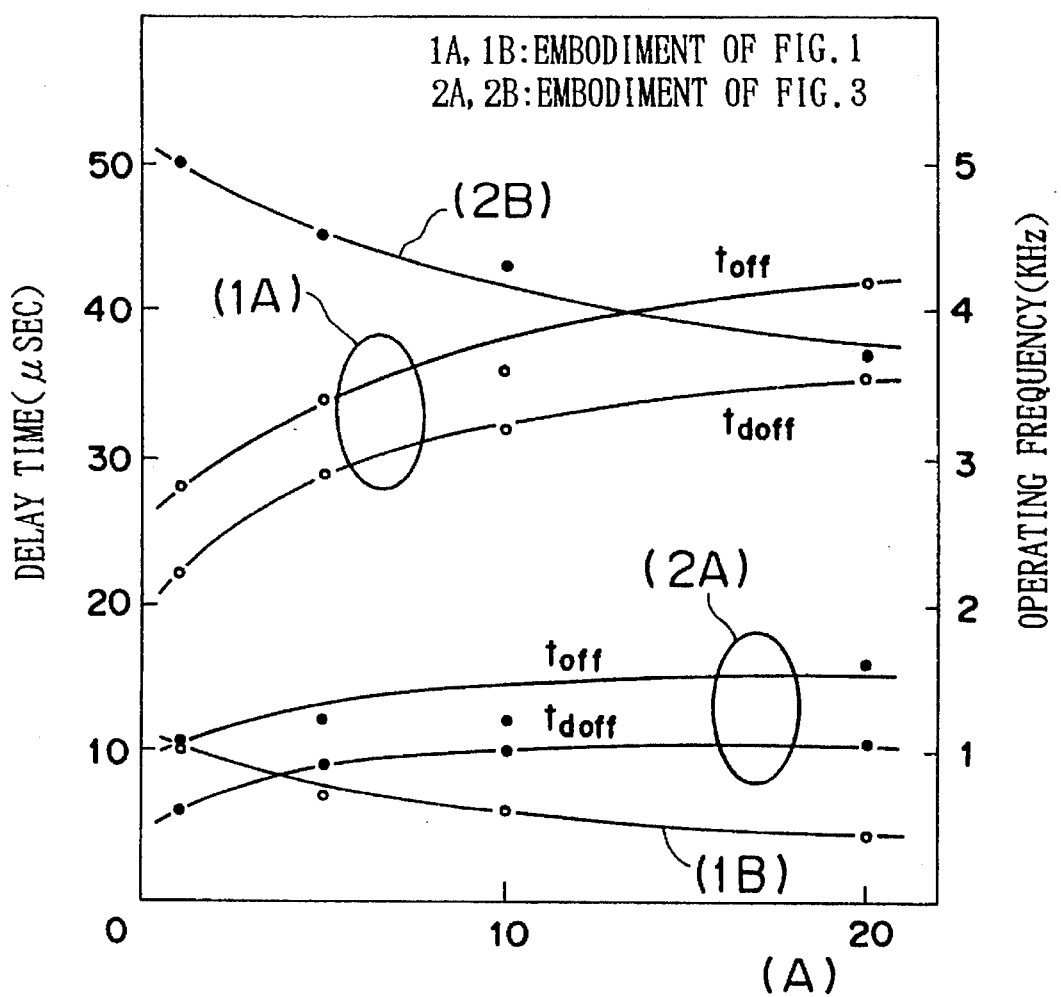
FIG. 5 is a graph showing a delay time and an operating frequency characteristic in relation to the turning-on current in the embodiments of FIGS. 1 and 3.

FIG. 5 shows a comparison in the switching characteristic of the photo SI thyristor driving circuits in FIG. 1 and FIG. 3, wherein the lateral axis thereof shows a current value of the turning-on current flowing into the photo SI thyristor and the longitudinal axis thereof shows a delay time (μsec) and operating frequency (KHz). Curves 1A and 1B in FIG. 5 shows the switching characteristic for the embodiment of FIG. 1, while curves 2A and 2B show the switching characteristic for the embodiment shown in FIG. 3.

In the embodiment shown in FIG. 1, at the turning-on current of 10 A, the turning-off descending time $t_{off}$ is on the order of 40 μsec, and the operating frequency is about 500 Hz. In the embodiment of FIG. 3, the turning-off descending time $t_{off}$ is about 15 μsec, and the operating frequency is more than 1 KHz and can be extended up to a maximum of 10 KHz. Although the embodiment of FIG. 3 is clearly superior to the embodiment of FIG. 1 as seen from the comparison in the operating frequency and the descending time in FIG. 5, the photo SI thyristor driving circuit of FIG. 1 has also a good switching characteristic in which it can be practically used as a photo relay without any problems.

Figure 6:
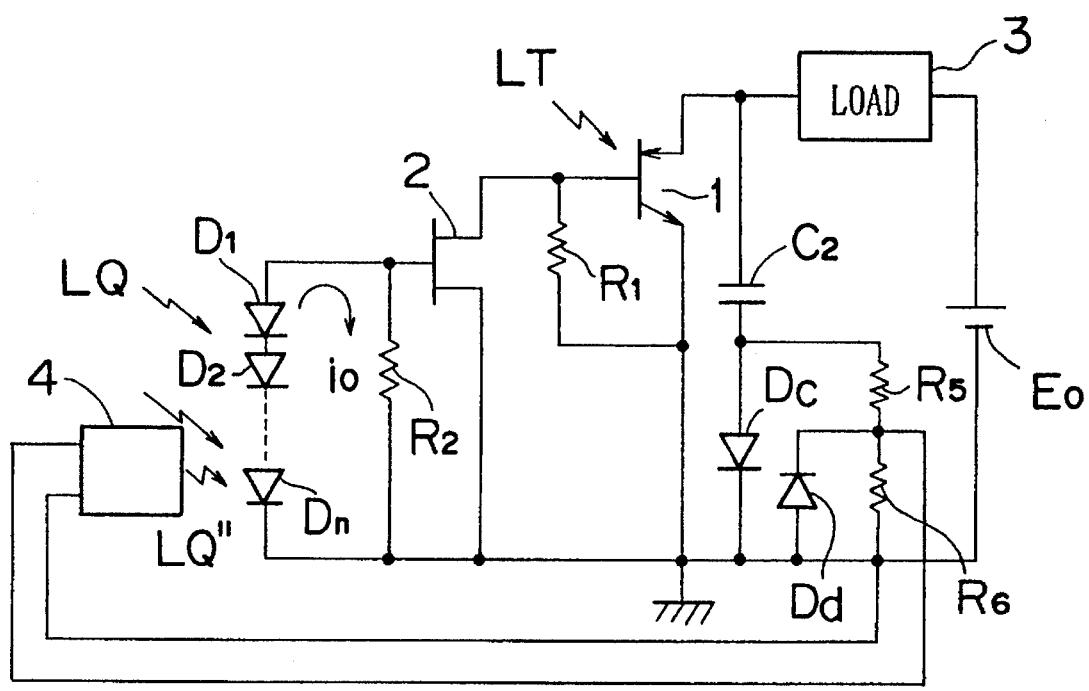
FIG. 6 is a circuit diagram showing one embodiment of a protection circuit of a photo SI thyristor driving circuit in accordance with the present invention.

Next, FIG. 6 is a circuit diagram showing an embodiment of the protection circuit of the photo SI thyristor driving circuit in accordance with the present invention.

In FIG. 6, a snubber circuit and a light emitting element 4 cooperating with the snubber circuit are comprised, as the protection circuit of the photo SI thyristor driving circuit, in addition to the photo SI thyristor driving circuit of FIG. 1.

The snubber circuit is connected between the anode and the cathode of the photo SI thyristor 1 and includes a series circuit including a snubber condensor C2 and a snubber diode Dc, voltage dividing compensation resistors R5 and R6 connected in series between the anode and the cathode of the snubber diode Dc, and a diode Dd connected in a reverse direction between both terminals of the resistor R6. By the voltage between both terminals of the resistor R6, the light emitting element 4 such as a light emitting diode is biased and emittted.

Figure 7:
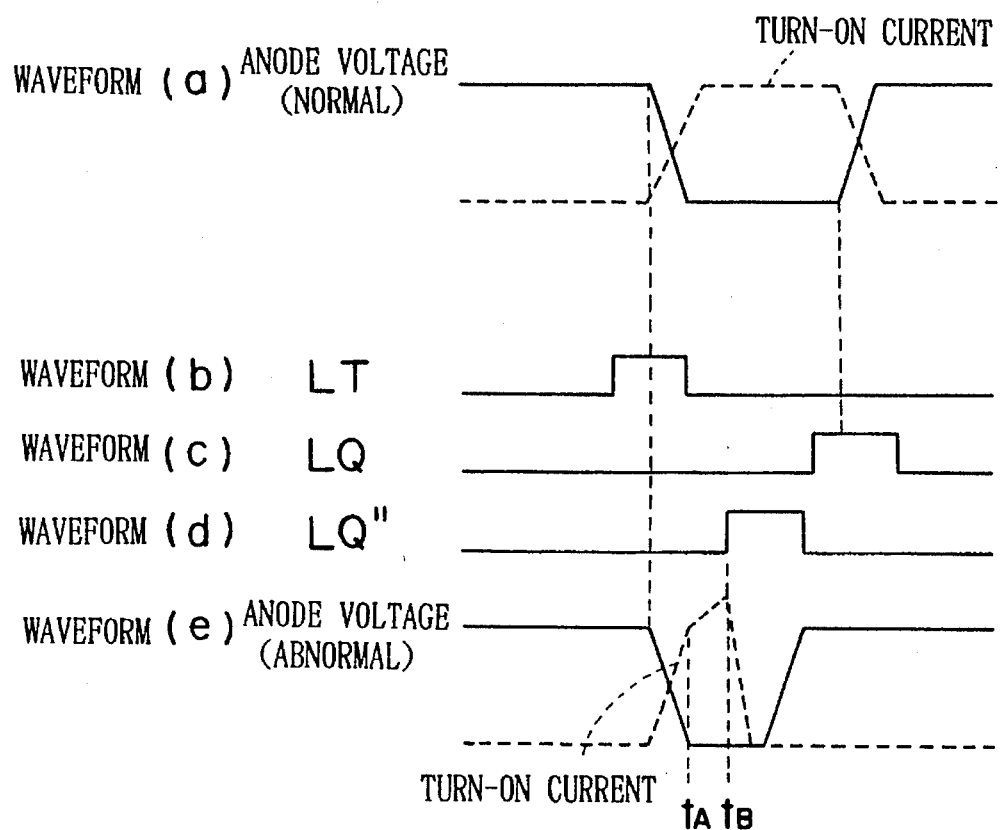
FIG. 7 is a timing diagram for explaining the operation of the protection circuit of the photo SI thyristor driving circuit of FIG. 6, wherein waveform (a) shows an anode voltage and a turning-on current of the photo SI thrysitor, waveform (b) shows a pulsed trigger light, waveform (c) shows a pulsed quenching light, waveform (d) shows a pulsed quenching light, and waveform (e) shows an anode voltage and a turning-on current at an abnormal condition.

The operation of the protection circuit will be explained below with reference to the timing diagram shown in FIG. 7. The waveform for normal operation is shown in FIG. 7 (a), wherein a solid line is a waveform showing the voltage of the anode of the photo SI thyristor 1, while a dashed line shows a current flowing between the anode and the cathode of the photo SI thyristor 1. The photo SI thyristor 1 is turned on when the trigger light LT is irradiated as shown by the waveform (b) of FIG. 7, whereby the turning-on current flows to lower the anode voltage. Subsequently, when the quenching light LQ irradiates to the photo diodes D1-Dn as shown by the waveform (c) of FIG. 7, the turning-on current is interrupted to raise the anode voltage as shown by the waveform (a) of FIG. 7.

Now, when an abnormal current flows into the snubber circuit due to the abnormal flowing of the turning-on current at time $t_A$ as shown in dashed line in FIG. 7 (e), the voltage between terminals of the diode Dc is applied to the resistors R5 and R6. A dividing voltage occurring across the resistor R6 and causes a current to flow into the light emitting element 4. At time $t_B$, the light emitting element 4 emits to irradiate the quenching light LQ" into the photo diodes D1-Dn. The MOS transistor 2 is turned on to interrupt the photo SI thyristor 1, thereby to prevent the flowing of overcurrent.

Next, another embodiment of the photo SI thyristor driving circuit in accordance with the present invention will be explained with reference to FIGS. 8 and 9.

In the above embodiments such as the photo SI thyristor driving circuit of FIG. 1, when the voltage of from 200 V to 1000 V is applied to the anode of the photo SI thyristor 1, it is possible that the photo SI thyristor 1 is not completely turned off. Such a problem can be overcome by the embodiments in FIGS. 8 and 9.

Figure 8A:
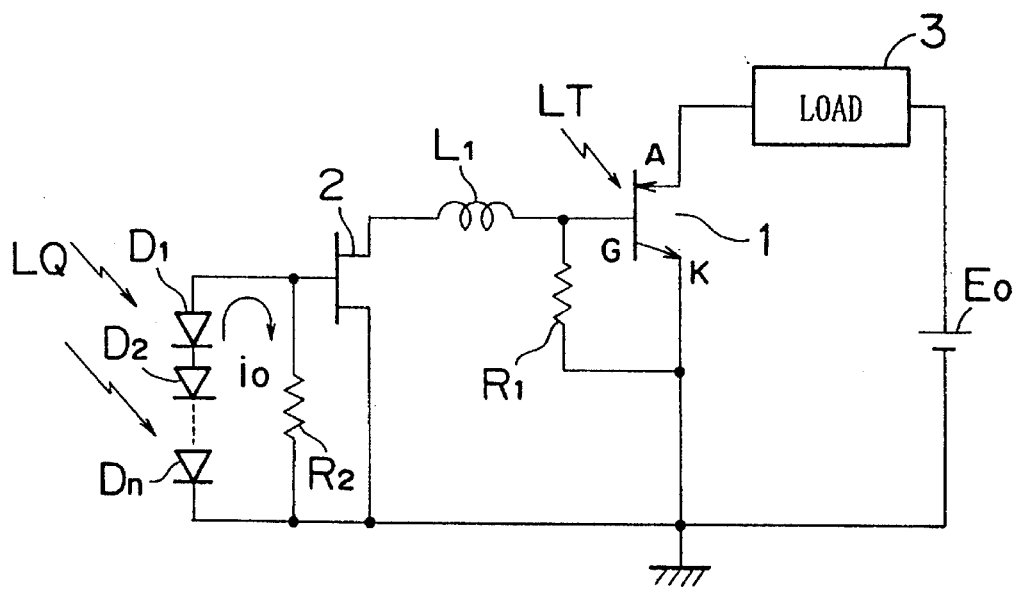
FIGS. 8A and 8B show other embodiments of the photo SI thrysitor driving circuits according to the present invention.

In FIG. 8A, a numeral 1 denotes a photo SI thyristor, 2 a MOS transistor such as a field effect transistor, and 3 a load. The anode of the photo SI thyristor 1 is connected to a voltage source $E_0$ through the load 3, the negative electrode of the voltage source $E_0$ and the cathode of the photo SI thyristor 1 being grounded. A resistor R1 is connected between the gate and the cathode of the photo SI thyristor 1, to the gate of which one end of an inductor L1 with inductance of about 1 μH is connected, the other end of the inductor L1 being connected to the drain of the MOS transistor 2. A resistor R2 is connected between the gate and the source of the MOS transistor 2. Photo diodes D1-Dn which are connected in series are connected in parallel to the resistor R2. The source of the MOS transistor 2 is grounded.

Figure 8B:
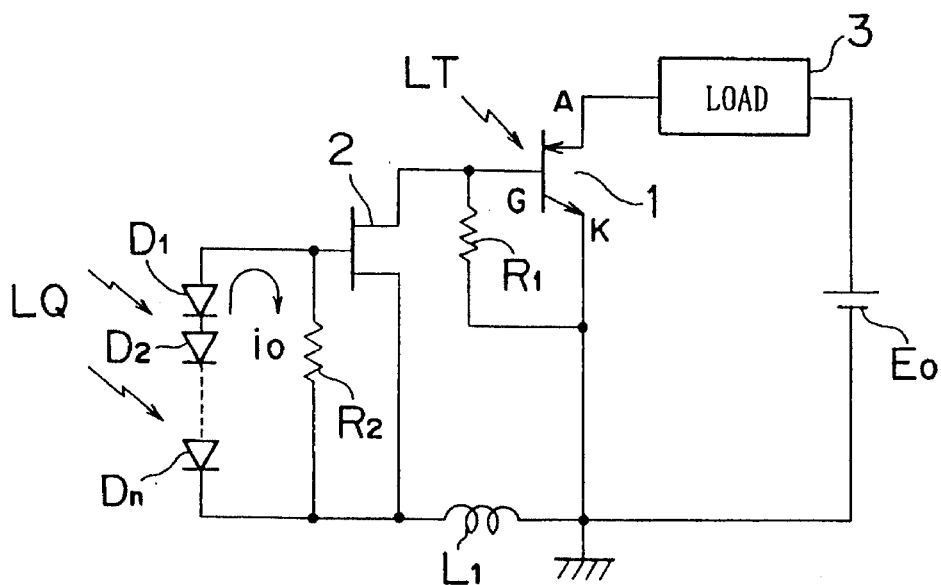

In the embodimenet shown in FIG. 8B, an inductor L1 is connected between the cathode of the photo SI thyristor 1 and the source of the MOS transistor 2, an inductance of the inductor L1 being about 1 μH.

In the following, the operation of the photo SI thyristor driving circuits shown in FIGS. 8A and 8B, when a high voltage (200 V–1000 V) is applied to the anode of the photo SI thyristor 1, will be explained in comparison with the operation of the embodiment of FIG. 1.

First, the operation where a voltage of 380 V, for example, is applied to the anode of the photo SI thyristor 1 in the embodiment of FIG. 1 will be explained.

As shown in FIG. 9 (d), when the trigger light LT is irradiated to the photo SI thyristor 1 at time t1, the photo SI thyristor 1 is turned on to cause the voltage between the gate and the cathode of the photo SI thyristor 1 to be about 1 volt, as shown in FIG. 9 (a). The anode voltage $V_A$ thereof becomes 0 volt descending from 380 volts, as shown in FIG. 9 (c).

Subsequently, as shown in FIG. 9 (d), when the quenching light LQ is applied to the photo diodes D1-Dn at time t2, the MOS transistor 2 is turned on and attempts to draw the charge accumulated at the gate of the photo SI thyristor 1 to turn off the photo SI thyristor 1. However, as clearly seen from the voltage waveform (a) in FIG. 9, the gate voltage $V_G$ of the photo SI thyristor 1 becomes unstable. Namely, with a large anode voltage $V_A$, the photo SI thyristor has a tendency to be turned on and has no tendency to be turned off.

Waveforms (e)–(g) shown in FIG. 9 show the switching operation of the embodiments illustrated in FIGS. 8A and 8B. Because of the existence of the inductor L1 connected between the gate of the photo SI thyristor 1 and the drain of the MOS transistor 2 or between the cathode of the photo SI thyristor 1 and the source of the MOS transistor 2, a negative voltage whose peak value is about −4 V is generated at the inductor L1 as a back electromotive force at the moment of the turning-off of the photo SI thyristor 1, whereby the gate voltage waveform is stabilized as shown in FIG. 9 (e). As shown by the gate current waveform in FIG. 9 (f), a sufficient gate current $I_G$ flows through the MOS transistor 2 to draw the charge accumulated at the gate of the photo SI thyristor 1, so that it is possible to positively turn off the photo SI thyristor 1 as shown in FIG. 9 (g).

In accordance with the present embodiment, even with the high anode voltage (200–1000 V), the photo SI thyristor 1 can be positively turned off. For example, with the anode voltage $V_A$ of 1000 V and the anode current $I_A$ of 20 A, the experimental result for the switching characteristic of the photo SI thyristor shows that the turning-on delay time $t_{don}$ is 2.8 μsec, the turning-on raising time tr is 0.8 μsec, the turning-off descending time $t_{doff}$ is 18 μsec and the turning-off delay time $t_{off}$ is 20.5 μsec.

1 μH has been found to be optimal for the value of the inductor L1, and with a value less than 1 μH, the the photo SI thyristor often fails to be turned off because of a lack of the back electromotive force generated. On the other hand, when the value of the inductor L1 is 1.1–5 μH, the gate current is limited at the time of running-off so as to delay the turning-off time. Further, with a value more than about 5 μH, a ringing occurs wherein the voltage largely changes to the negative direction and rebounds to the positive side at the next moment. The voltage rebounding to the positive side is applied to the gate of the photo SI thyristor, whereby there is a possibility of failure in turning off the photo SI thyristor.

Thus, because of the existence of the inductor L1 provided between the gate of the photo SI thyristor 1 and the drain of the MOS transistor 2 or between the cathode of the photo SI thyristor 1 and the source of the MOS transistor 2, a negative voltage is generated from the inductor L1 due to the back electromotive force to be applied to the gate of the photo SI thyristor 1, whereby the photo SI thyristor can be surely turned off. Accordingly, a negative voltage source is not required.

Next, another embodiment of the photo SI thyristor driving circuit in accordance with the present invention which can perform at a high frequency with high switching speed will be explained with reference to FIGS. 10A and 10B.

Figure 10A:
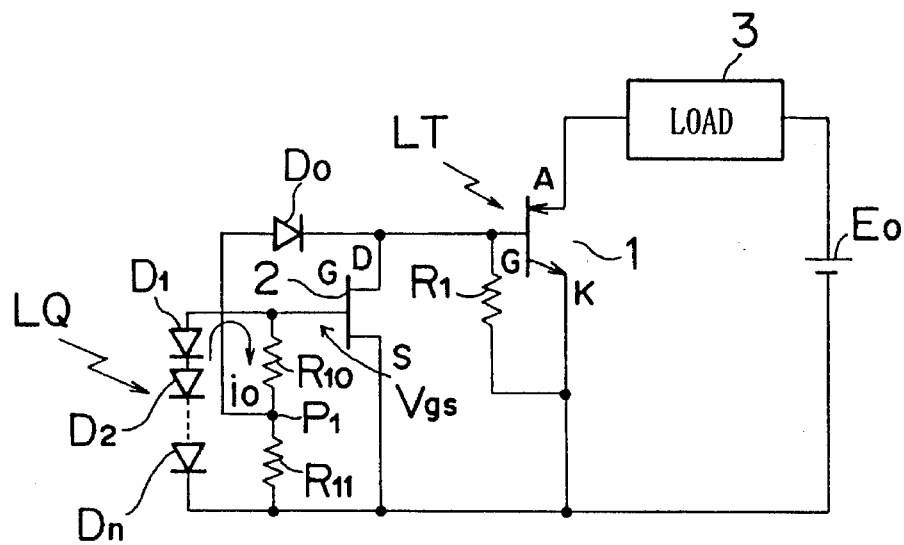
FIG. 10A is a circuit diagram showing another embodiment of the photo SI thyristor driving circuit in accordance with the present invention.

The embodiment shown in FIG. 10A is generally identical in a circuit constitution to the embodiment shown in FIG. 1, but the gate circuits in FIG. 1 and FIG. 10A of the MOS transistor 2 are different. The gate circuit in FIG. 1 comprises the resistor R2 connected between the gate and the source of the MOS transistor 2, while the gate circuit in FIG. 10A has resistors R10 and R11 connected in series between the gate and the source of the MOS transistor 2, and a diode D0 whose anode is connected to a connecting point P1 of the resistors R10 and R11 and whose cathode is connected to the drain of the MOS transistor 2.

As explained before, the photo SI thyristor 1 is turned on by irradiating the trigger light LT thereto, while the photo SI thyristor 1 is turned off by irradiating the quenching light LQ to the photo diodes D1-Dn to generate a bias voltage for turning on the MOS transistor 2 thereby to draw the charges accumulated in the gate of the photo SI thyristor 1. In order to operate the driving circuit at a high frequency or at a high switching speed, it is also important how quickly the charge which has accumulated in the gate of the MOS transistor 2 is drawn from the gate to turn off the MOS transistor 2 after irradiating the quenching light LQ to the photo diodes D1-Dn to turn off the photo SI thyristor 1.

In the embodiment of FIG. 10A, the charge which has accumulated in the gate of the MOS transistor 2 is drawn as a drain current through the diode $D_0$ and the resistor R10 when the MOS transistor 2 is turned on, thereby to enable to short reducing the time required until the MOS transistor 2 is subsequently turned off. FIG. 10B shows the waveform diagram for explaining the embodiment of FIG. 10A.

Using FIG. 10B, the operation will be explained in further detail. When the quenching light LQ is irradiated to the photo diodes D1-Dn, the voltage between the gate and the source of the MOS transistor 2 gradually rises to flow a photo current $i_0$ into the resistors R10 and R11 connected in series. The MOS transistor 2 is biased by the voltage generated across the resistors R10 and R11 to become in the turned-on condition. Over the duration T0 in which the quenching light LQ is irradiated to the photo diodes D1-Dn, the voltage Vgs between the gate and the sou race of the MOS transistor 2 rises to keep the turned-on condition of the MOS transistor 2 and to lower the drain voltage of the MOS transistor 2. When the irradiation of the quenching light LQ is completed, the charge which has accumulated in the gate of the MOS transistor 2 rapidly flows to the ground through the resistor $R_{10}$ and the diode $D_0$ as well as through the MOS transistor 2 which is in the turned-on condition.

For your information, the value of the resistor R10 is set to 2–10 KΩ, and the value of the resistor R11 is set to more than 100 KΩ, for example. Because of the potential difference occurring by the above setting between the connecting point P1 and the drain electrode of the MOS transistor 2, the charges of the gate of the MOS transistor are easily discharged through the diode $D_0$.

Figure 10B:
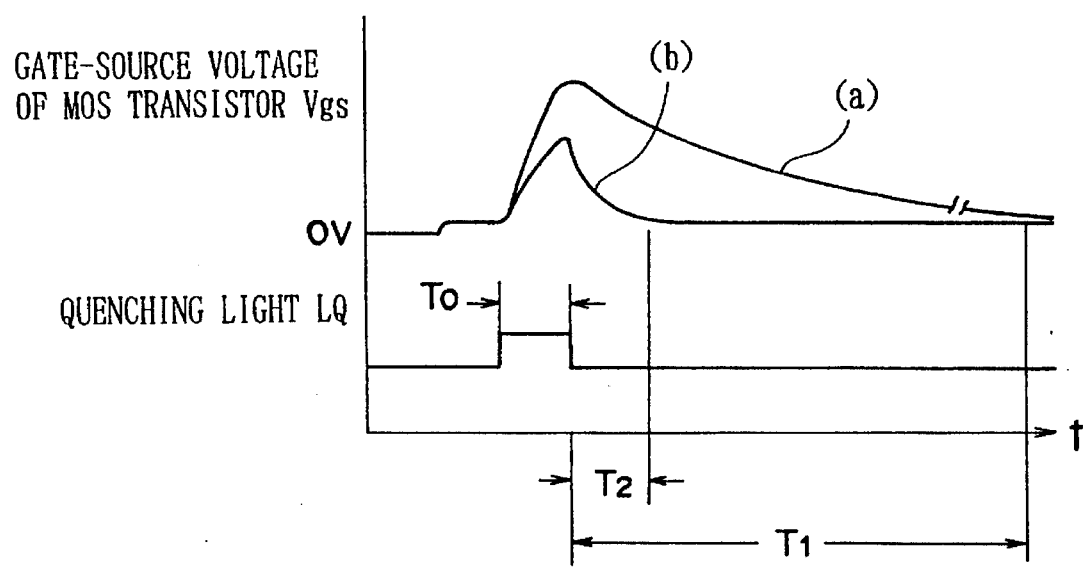
FIG. 10B is a timing diagram for explaining the operation characteristic of the embodiment of FIG. 10A.

In FIG. 10B, a line (a) shows a waveform of the voltage Vgs between the gate and the source of the MOS transistor 2 with removing the diode $D_0$ from the embodiment of FIG. 10A, and a line (b) shows a waveform of the voltage Vgs between the gate and the source of the MOS transistor 2 with the diode $D_0$. As clearly seen from FIG. 10B, with the diode $D_0$ connected between the connecting point P1 and the drain of the MOS transistor 2, the charges accumulated at the gate of the MOS transistor 2 is rapidly drawn through the diode $D_0$. The charge drawing time (discharge time) T2 with the diode $D_0$ connected therebetween is very shorter than the charge drawing time T1 with removing the diode $D_0$ from FIG. 10A, the relationship therebetween being T1>>T2, as seen from FIG. 10B. Further, the raising characteristic of the waveform of the voltage Vgs with the diode $D_0$ connected therebetween can be restrained at a low level, as seen from FIG. 10B. Accordingly, with this embodiment having the diode $D_0$, the high speed switching characteristic can be improved at least ten times in comparison with the circuit constitution not having the diode $D_0$.

Even if the charge remains in the gate of the photo SI thyristor 1 after the completion of the irradiation of the quenching light LQ, as the MOS transistor 2 is kept in the biased condition for a while by the discharge current flowing through the diode $D_0$, it is possible to cause the charges remaining in the gate of the photo SI thyristor to be drawn by adjusting the period in which the MOS transistor 2 is kept in the biased condition. This enables the switching performance of the photo SI thyristor 1 to be stable.

Next, another embodiment of the photo SI thyristor driving circuit according to the present invention will be explained with reference to FIGS. 11A, 11B, 12, 13 and 14.

Figure 11A:
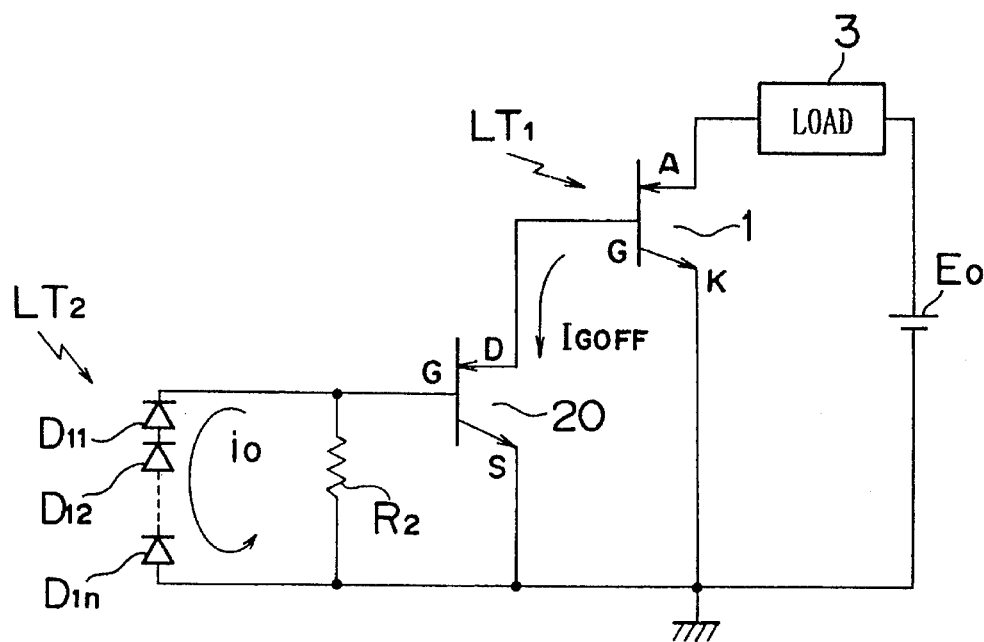
FIG. 11A is a circuit diagram showing yet another embodiment of the photo SI thyristor driving circuit according to the present invention.

In FIG. 11A, a numeral 1 denotes a photo SI thyristor, and 20 denotes a normally turning-on type SI transistor (referred to as "SIT", hereinafter). The anode of the photo SI thyristor 1 is connected to a positive electrode of a voltage source $E_0$ through the load 3, the negative electrode of the voltage source E0 and the cathode of the photo SI thyristor 1 are grounded. The drain of the SIT 20 is connected to the gate of the photo SI thyristor 1, and the source of the SIT 20 is grounded. A resistor R2 is connected between the gate and the source of the SIT 20. Photo diodes D11-D1n which are connected in series are connected as photo electromotive elements in parallel with the resistor R2. The cathode of the photo diode D11 is connected to the gate of the SIT 20 and to one end of the resistor R2, and the anode of the photo diode D1n is grounded An example of the structure of the normally turning-on type SIT 20 is shown in cross-section in FIG. 11B. P-type gate diffusion layers 11 and channel regions 12 formed by $n^-$-type diffusion layers are formed on an $n^+$-type semiconductor substrate 10. A numeral 13 denotes insulating films, 14 source diffusion layers consisting of p-type diffusion layers formed on the $n^-$-type diffusion layers, 15 a source electrode, 16 a gate electrode and 17 a drain electrode.

This SIT 20 has a characteristic in which the drain current lowers as the gate voltage Vg diminishes in the direction of a negative voltage from zero volt, as clearly seen from a drain current-drain voltage characteristic in relation to the gate voltage Vg shown in FIG. 12.

The principle of the operation of the normally turning-on type SIT will be briefly explained with reference to FIGS. 13A and 13B. As shown in FIG. 13A, if the gate-source voltage of the SIT is set to zero, the SIT is in the turning-on condition, because there is no occurrence of the depletion layer in the channel regions. The resistance between the drain and the source of the SIT is at a degree of 50 mΩ so that a sufficient current flows therebetween. On the other hand, as shown in FIG. 13B, when the gate-source voltage of the SIT is at −3 V, the depletion layer extends to the channel regions to prevent the current from passing therethrough. Thus, such an SIT device having a characteristic in which the drain-source resistance thereof changes depending on the voltage applied to the gate electrode thereof is utilized. A structure for an SIT device should not be limited to that shown here, but any structure having the above-described characteristic can be utilized.

Figure 11B:
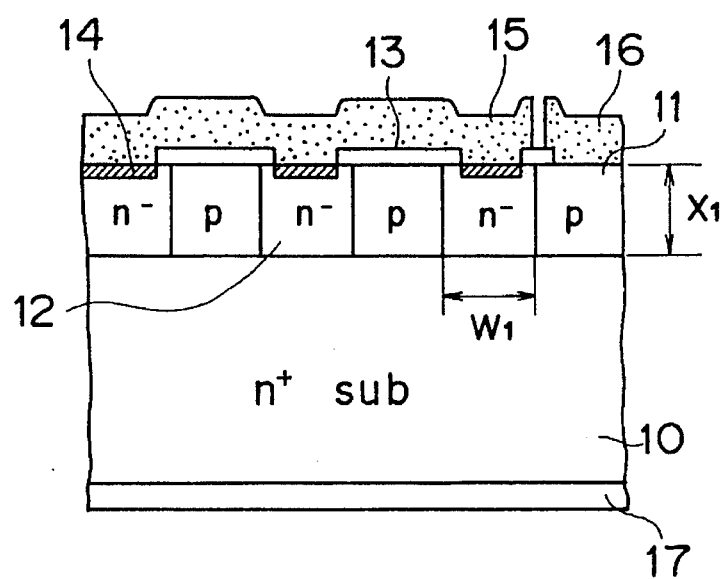
FIG. 11B is a cross-sectional view of an SIT element used in the embodiment shown in FIG. 11A.

Use of the SIT device shown in FIG. 11b the channel length W1 and the diffusion depth X1 are set to 5 μm, a sufficient characteristic therefor can be obtained with a chip size of 7×7 mm.

Figure 14:
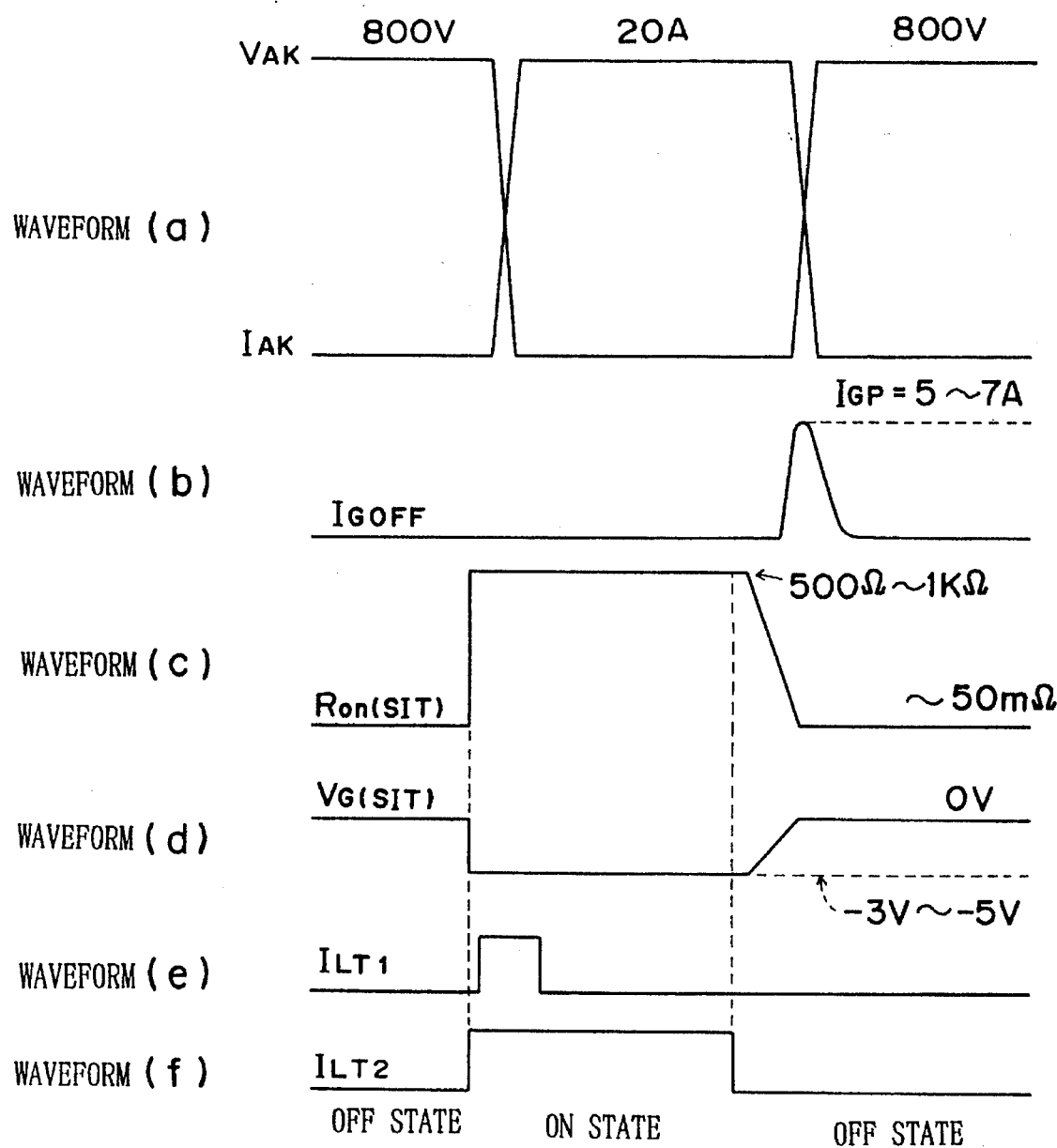
FIG. 14 is a timing diagram for explaining the operation of the photo SI thyristor driving circuit of FIG. 11A.
Figure 15:
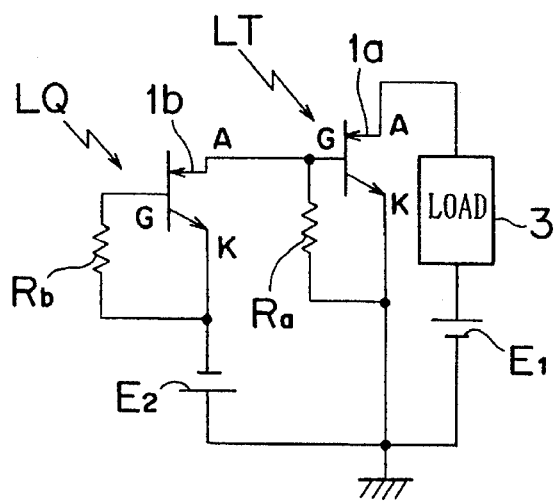
FIG. 15 is a circuit diagram showing an example of the photo SI thyristor driving circuit of the prior art.
Figure 16:
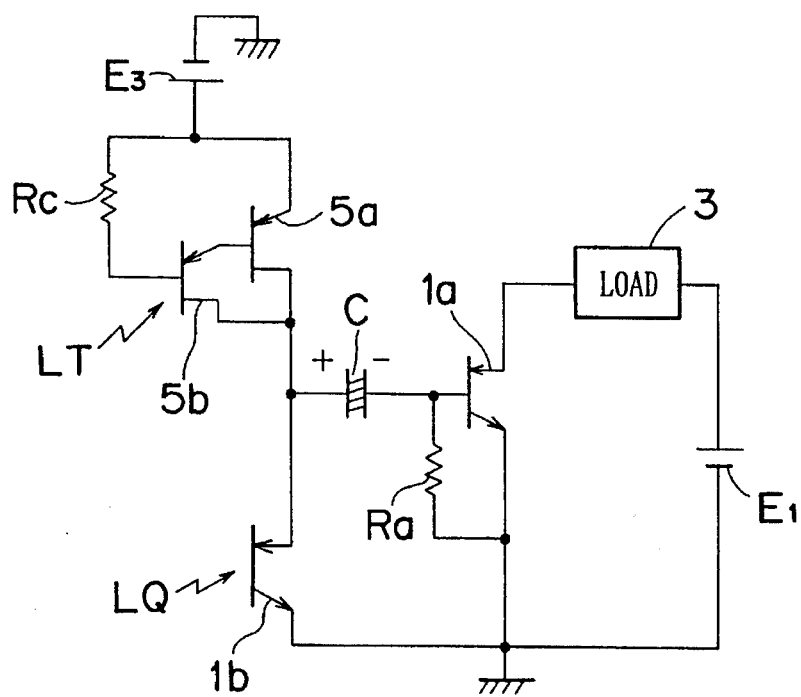
FIG. 16 is a circuit diagram showing another example of the photo SI thyristor driving circuit in the prior art.

Next, the operation of the photo SI thyristor driving circuit shown in FIG. 11A will be explained with reference to the waveform diagrams (a)–(f) in FIG. 14. In FIG. 14, (a) shows waveforms of the anode voltage $V_{AK}$ and the anode current $I_{AK}$ of the photo SI thyristor 1, (b) shows a waveform of the turning-off current $I_{GOFF}$ of the photo SI thyristor 1, (c) is a waveform showing the change of the turning-on resistance value of the SIT 20, (d) is a waveform showing the change of the gate voltage of the SIT 20, (e) is a current waveform of the triggering current $I_{LT1}$ supplied to a light emitting element (not shown) such as a light emitting diode for triggering the photo SI thyristor 1, and (f) shows a current waveform of the current $I_{LT2}$ supplied to a light emitting element (not shown) such as a light emitting diode irradiating light to a light-electromotive force element.

First, the operation for turning on the photo SI thyristor 1 will be explained.

As shown in the current waveform (f) of FIG. 14, prior to the turning-on of the photo SI thyristor 1, the current $I_{LT2}$ is caused to flow into the light emitting element (not shown) in order to irradiate the light LT2 to the photo diodes D11-D1n (photo-electromotive force elements) to generate the electromotive force at the photo diodes D11-D1n. Due to the electromotive force generated at the photo diodes D11-D1n, the photo current $i_0$ is caused to flow into the resistor R2 to generate the terminal voltage across the resistor R2, by which a negative bias voltage is applied to the gate electrode of the normally turning-on type SIT 20.

Thereby, the voltage applied to the gate of the SIT 20 is lowered from 0 V of the normal condition to −3 V—5 V as shown in FIG. 14 (d), so that the resistance value between the drain and the source of the SIT 20 is increased from a normal low resistance value (50 mΩ) to a high resistance value (about 500Ω–1 KΩ), as shown in FIG. 14 (c).

After the resistance value between the drain and the source of the SIT 20 is increased, the triggering current $I_{LT1}$ is caused to flow into the light emitting diode (not shown) as shown in FIG. 14 (e) in order to irradiate the trigger light LT1 to the photo SI thyristor 1 to turn on the same. As shown in FIG. 14 (a), an anode current $I_{AK}$ on the order of 20 A flows through the photo SI thyristor 1.

Subsequently, the operation for turning off the photo SI thyristor 1 will be explained. As shown in FIG. 14 (f), when the current $I_{LT2}$ which has been supplied to the light emitting element for irradiating light to the photo diodes D11-D1n is interrupted, the resistance value (500Ω–1 KΩ) between the drain and the source of the SIT 20 gradually diminishes up to a low resistance value (less than 50 mΩ). As shown in FIG. 14 (b), the turning-off gate current $I_{GOFF}$ with the peak current value 5–7 A flows from the gate of the photo SI thyristor 1 through the drain-source of the SIT 20, so as to rapidly draw the charges accumulated at the gate of the photo SI thyristor 1 to turn off the same.

In this embodiment, when the photo SI thyristor 1 is in the turning-off condition, the resistance value between the drain and the source of the SIT is low, so that the gate and the source of the photo SI thyristor 1 are substantially in the short-circuit condition. This improves the dv/dt endurance of the photo SI thyristor 1, and effectively prevents the erroneous operation.

Further, as the normally turning-on type SIT provided between the gate and the source of the photo SI thyristor is controlled by a negative bias voltage generated across the resistor R2 through which the photo current I0 from the photo electromotive force elements is flowed, it is not necessary to provide the photo SI thyristor driving circuit with a negative voltage source installed at the outside of a package, which has been needed in the prior art.

As described above, in the present invention, the bias circuit for the MOS transistor or the SIT comprises the photo diodes (photo electromotive force elements) and the resistor through which the photo current from the photo diodes is flowed, wherein the terminal voltage generated across the resistor are used as the bias voltage for the MOS transistor or the SIT. However, the bias circuit is not limited to the embodiments shown, but can comprise photo transistors or diode-connected photo transistors, for example. Notwithstanding, the photo diodes are most optimal for use in the bias circuit, because the photo diodes have simple structures and are easy to integrate into the circuit.

The inductor for generating a back electromotive force can be formed on the semiconductor substrate, or can be hybridized or connected outside. Further, to stabilize the switching operation by generating a negative voltage of a back electromotive force in the inductor can be applied to all the above-described embodiments.

Further, it is clear that the protection circuit for protecting elements from being broken due to thermal runaway, which comprises the snubber circuit between the anode and the cathode of the photo SI thyristor to turn off the photo SI thyristor by the current from the snubber circuit, can be applied to all the above-described embodiments.

In case of applying this protection circuit to the photo SI thyristor driving circuit shown in FIG. 11A, there is provided controlling means operative to interrupt light LT2 when the snubber circuit connected between the anode and the cathode of the photo SI thyristor generates an output due to an excess current. After the emission of the light LT2 is interrupted, the resistance between the drain and the source of the normally turning-on type SI transistor lowers whereby the photo SI thyristor is turned off.

As described above, in accordance with the present invention, a photo relay using the photo SI thyristor which has a good switching characteristic can be advantageously obtained.

Namely, although in the prior photo SI thyristor driving circuit a negative voltage source must be provided at the outside of a package to turn off the photo SI thyristor, the photo SI thyristor driving circuit in accordance with the present invention can be simply constituted because the negative voltage source can be deleted for the reason that the MOS transistor which is biased by a photo electromotive force is provided to forcedly draw the charges accumulated in the gate of the photo SI thyristor to turn off the photo SI thyristor.

Further, without the negative bias voltage source which was needed to turn off the photo SI thyristor driving circuit, as there is no delay which has occurred due to the internal resistance of the negative bias voltage source, the switching characteristic of the driving circuit is highly improved, which enables it to operate at a high frequency.

A photo relay which, of course, has a high voltage-withstand characteristic of more than 800 volts which is inherent in the photo SI thyristor, and which is suitable for opening and closing a large current greater than 20 amperes can be obtained. Further, the photo SI thyristor driving circuit which is electrically and thermally stable and highly reliable can be obtained.

Further, as it is possible to prevent elements in the driving circuit from being broken due to an excess current, by turning off the photo SI thyristor by means of a snubber circuit provided between the anode and the cathode of the photo SI thyristor when an abnormal current greater than a predetermined current value flows, a more reliable driving circuit can be obtained.

Moreover, as the negative voltage due to the back electromotive force is generated by means of the inductor provided between the gate of the photo SI thyristor and the drain of the MOS transistor or between the cathode of the photo SI thyristor and the source of the MOS transistor, the photo SI thyristor in the photo SI thyristor driving circuit can be positively turned off.

Yet, as the charges accumulated in the gate of the MOS transistor is drawn by means of the diode, the switching characteristic of the driving circuit can be improved, which enables the driving circuit to operate at a higher frequency.

Further, in case of utilizing the normally turning-on type SIT as the controlling element for the photo SI thyristor, there is no need to provide a negative voltage source installed at the outside of a package, whereby the constitution of the driving circuit can be extremely simplified. Moreover, dv/dt endurance in the photo SI thyristor driving circuit is improved by using the normally turning-on type SIT, this being effective for preventing an erroneous operation.

While the embodiments of the present invention, as herein disclosed, constitute a preferred form, it is to be understood that other forms might be adopted.

What we claim is:

1. A photo SI thyristor driving circuit comprising:

a single photo SI thyristor;

transistor means provided in a gate circuit of said photo SI thyristor for drawing charges accumulated at the gate of said photo SI thyristor when said photo SI thyristor is turned off; and photo electromotive force means provided in a gate circuit of said transistor means for generating a photo current for applying a gate voltage to the gate of said transistor means.

2. A photo SI thyristor driving circuit, as recited in claim 1, wherein said transistor means includes a MOS transistor which is biased by said gate voltage.

3. A photo SI thyristor driving circuit comprising:

a single photo SI thyristor;

transistor means provided in a gate circuit of said photo SI thyristor for drawing charges accumulated at the gate of said photo SI thyristor when said photo SI thyristor is turned off;

photo electromotive force means provided in a gate circuit of said transistor means for generating a photo current for biasing said transistor means;

a condenser connected in parallel to said photo electromotive force means to be charged by said photo current from said photo electromotive force means; and a photo coupler provided in the gate circuit of said transistor means for supplying the photo current from said photo electromotive force means and the charged current from said condenser.

4. A photo SI thyristor driving circuit as recited in claim 1, 2 or 3, further comprising an inductor connected between the gate of said photo SI thyristor and the drain of said transistor means or between the cathode of said photo SI thyristor and the source of said transistor means.

5. In a photo SI thyristor driving circuit comprising a photo SI thyristor and a MOS transistor biased by a voltage due to a current from a photo electromotive force means to draw charges accumulated at the gate of said photo SI thyristor, and a protection circuit for said photo SI thyristor driving circuit, said protection circuit comprising:

a snubber circuit connected between the anode and the cathode of said photo SI thyristor; and a light emitting element for irradiating light to said photo electromotive force means by means of the output from said snubber circuit wherein said photo SI thyristor is controlled by the emitting of said light emitting element.

6. A photo SI thyristor driving circuit comprising:

a photo SI thyristor;

a MOS transistor means provided in a gate circuit of said photo SI thyristor for drawing charges accumulated at the gate of said photo SI thyristor when said photo SI thyristor is turned off;

photo electromotive force means provided in a gate circuit of said MOS transistor means for generating a photo current;

at least two resistors connected in series generating a voltage for biasing said MOS transistor means by means of said photo current from said photo electromotive force; and a diode connected between the drain of said MOS transistor means and a connecting point of said two resistors.

7. A photo SI thyristor driving circuit comprising:

a single photo SI thyristor; and a normally turning-on type SI transistor whose drain is connected to the gate of said photo SI thyristor and whose source is connected to the cathode of said photo SI thyristor, wherein said photo SI thyristor is turned on by being irradiated with a trigger light after the resistance between the drain and the source of said SI transistor is increased, and wherein said photo SI thyristor is turned off when the resistance between the drain and the source of said SI transistor is lowered.

8. A photo SI thyristor driving circuit comprising:

a single photo SI thyristor;

a normally turning-on type SI transistor whose drain is connected to the gate of said photo SI thyristor and whose source is connected to the cathode of said photo SI thyristor;

a photo electromotive force means whose anode is connected to the gate of said SI transistor and whose cathode is connected to the source of said SI transistor; and a resistor connected in parallel with said photo electromotive force means.

9. A photo SI thyristor driving circuit as recited in claim 7 or 8, further comprising an inductor connected between the gate of said photo SI thyristor and the drain of said SI transistor or between the cathode of said photo SI thyristor and the source of said SI transistor.

10. A protection circuit for a photo SI thyristor driving circuit as recited in claim 7 or 8, comprising:

a snubber circuit connected between the anode and the cathode of said photo SI thyristor; and controlling means for controlling said SI transistor to lower the resistance between the drain and the source of said SI transistor when an output from said snubber circuit is received, thereby turning off said photo SI thyristor.

11. A photo SI thyristor driving circuit as recited in any one of claims 1, 2, 3, 5, 6, 7 or 8, wherein said photo electromotive force means includes a plurality of photo diodes connected in series.

* * * * *